US012604458B2

(12) United States Patent　　　　　(10) Patent No.: US 12,604,458 B2

Honda et al.　　　　　　　　　　　　(45) Date of Patent: Apr. 14, 2026

(54) APPARATUS COMPRISING A METAL PORTION IN THE TOP PORTION OF CAPACITOR STRUCTURE, AND RELATED METHODS

(71) Applicant: MICRON TECHNOLOGY, INC., Boise, ID (US)

(72) Inventors: Harutaka Honda, Hiroshima (JP); Shogo Omiya, Hiroshima (JP); Shoko Norifusa, Hiroshima (JP); Hidekazu Nobuto, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 694 days.

(21) Appl. No.: 17/931,717

(22) Filed: Sep. 13, 2022

(65) Prior Publication Data

US 2024/0090197 A1　　Mar. 14, 2024

(51) Int. Cl.
H10B 12/00　　　　(2023.01)

(52) U.S. Cl.
CPC ........... H10B 12/31 (2023.02); H10B 12/033 (2023.02); H10B 12/09 (2023.02); H10B 12/50 (2023.02)

(58) Field of Classification Search
CPC .............................. H10B 12/31; H10B 12/033
See application file for complete search history.

(56) References Cited

U.S. PATENT DOCUMENTS

| | | | |
|---|---|---|---|
| 5,668,394 A | 9/1997 | Lur et al. | |
| 6,902,763 B1 | 6/2005 | Elers et al. | |
| 9,171,847 B1 | 10/2015 | Lee et al. | |
| 9,431,496 B2 | 8/2016 | Kang | |
| 9,530,849 B2 | 12/2016 | Oh et al. | |
| 9,564,435 B2 | 2/2017 | Chung et al. | |
| 9,704,716 B2 | 7/2017 | Blomberg et al. | |
| 9,768,177 B2 | 9/2017 | Nobuto | |
| 9,905,755 B2 | 2/2018 | Masuoka et al. | |
| 9,991,200 B2 | 6/2018 | Ting et al. | |
| 10,002,874 B2 | 6/2018 | Nobuto | |
| 10,103,152 B2 | 10/2018 | Kim et al. | |
| 10,128,437 B1 | 11/2018 | Fantini et al. | |

(Continued)

FOREIGN PATENT DOCUMENTS

| | | | | |
|---|---|---|---|---|
| CN | 208655649 U | 3/2019 | | |
| CN | 114899188 A | * 8/2022 | ....... H01L 21/76895 |

(Continued)

OTHER PUBLICATIONS

Sharma, et al., "Analysis of Triple Metal Surrounding Gate (TM-SG) 111-V Nanowire MOSFET for Photosensing Application", Opto-Electronics Review, vol. 26, (2018), pp. 141-148.

(Continued)

*Primary Examiner* — Edward Chin

(74) *Attorney, Agent, or Firm* — Dorsey & Whitney LLP

(57)　　　　　　ABSTRACT

An apparatus includes: a plurality of capacitors each including first and second conductive portions and a dielectric portion therebetween; a first conductive structure containing the plurality of capacitors therein, and electrically coupled to the second conductive portions of the plurality of capacitors; a second conductive structure on a top surface of the first conductive structure; and a third conductive structure on a top surface of the second conductive structure.

17 Claims, 9 Drawing Sheets

(56) References Cited

U.S. PATENT DOCUMENTS

| | | |
|---|---|---|
| 10,297,672 B2 | 5/2019 | Mun et al. |
| 10,304,943 B2 | 5/2019 | Lee et al. |
| 10,325,921 B2 | 6/2019 | Mihara |
| 10,381,366 B1 | 8/2019 | Takahashi et al. |
| 10,388,530 B2 | 8/2019 | Ogawa et al. |
| 10,573,522 B2 | 2/2020 | Jandl et al. |
| 10,734,288 B2 | 8/2020 | Kim |
| 11,088,144 B2 | 8/2021 | Seo |
| 11,348,795 B2 | 5/2022 | Schloss et al. |
| 2002/0135007 A1 | 9/2002 | Koike et al. |
| 2004/0021161 A1 | 2/2004 | Agarwal |
| 2007/0131985 A1 | 6/2007 | Fujita et al. |
| 2008/0012058 A1 | 1/2008 | Nobuto |
| 2008/0296674 A1 | 12/2008 | Graham et al. |
| 2010/0108976 A1 | 5/2010 | Jayasekara et al. |
| 2010/0213541 A1 | 8/2010 | Jeon et al. |
| 2011/0260239 A1 | 10/2011 | Oyu |
| 2011/0260242 A1 | 10/2011 | Jang |
| 2012/0161218 A1 | 6/2012 | Niitsuma et al. |
| 2013/0043056 A1 | 2/2013 | Cho |
| 2014/0015034 A1 | 1/2014 | Ryu et al. |
| 2014/0054536 A1 | 2/2014 | Lee |
| 2014/0159145 A1 | 6/2014 | Park et al. |
| 2014/0273452 A1 | 9/2014 | Blomberg et al. |
| 2014/0365723 A1 | 12/2014 | Oh et al. |
| 2015/0093869 A1 | 4/2015 | Juengling et al. |
| 2015/0144994 A1 | 5/2015 | Sung et al. |
| 2015/0214313 A1 | 7/2015 | Oh et al. |
| 2015/0214314 A1 | 7/2015 | Oh |
| 2015/0214362 A1 | 7/2015 | Oh |
| 2015/0263111 A1 | 9/2015 | Jang |
| 2015/0270271 A1* | 9/2015 | Sakamoto ............ H10D 1/042 |
| | | 257/306 |
| 2015/0349073 A1 | 12/2015 | Kang |
| 2015/0371991 A1 | 12/2015 | Nobuto |
| 2016/0133560 A1 | 5/2016 | Landgraf et al. |
| 2016/0149002 A1 | 5/2016 | Sharangpani et al. |
| 2016/0172488 A1 | 6/2016 | Oh et al. |
| 2016/0315088 A1 | 10/2016 | Kang et al. |
| 2016/0322377 A1 | 11/2016 | Ide |
| 2016/0336414 A1 | 11/2016 | Kang |
| 2017/0040327 A1 | 2/2017 | Nobuto |
| 2017/0047421 A1 | 2/2017 | Oh et al. |
| 2017/0069735 A1 | 3/2017 | Oh et al. |
| 2017/0125422 A1 | 5/2017 | Kang |
| 2017/0125532 A1 | 5/2017 | Jang |
| 2017/0186752 A1* | 6/2017 | Choi .................. H01L 21/0223 |
| 2017/0186844 A1 | 6/2017 | Kim et al. |
| 2017/0229306 A1 | 8/2017 | Luan et al. |
| 2017/0365608 A1 | 12/2017 | Lee et al. |
| 2017/0373079 A1 | 12/2017 | Sharangpani et al. |
| 2018/0053769 A1 | 2/2018 | Kim et al. |
| 2018/0151740 A1 | 5/2018 | Wu et al. |
| 2018/0219014 A1 | 8/2018 | Danek et al. |
| 2018/0342520 A1 | 11/2018 | Chun |
| 2019/0019725 A1 | 1/2019 | Chandrashekar et al. |
| 2019/0027582 A1 | 1/2019 | Lee et al. |
| 2019/0259839 A1 | 8/2019 | Ryu |
| 2019/0267284 A1 | 8/2019 | Lee et al. |
| 2020/0006352 A1 | 1/2020 | Avci et al. |
| 2020/0006431 A1 | 1/2020 | Mayuzumi et al. |
| 2020/0006479 A1 | 1/2020 | Reznicek et al. |
| 2020/0051852 A1 | 2/2020 | Suzawa |
| 2020/0066726 A1 | 2/2020 | Fishburn et al. |
| 2020/0066750 A1 | 2/2020 | Takahashi et al. |
| 2020/0075617 A1 | 3/2020 | Saxler |
| 2020/0091088 A1 | 3/2020 | Wakatsuki et al. |
| 2020/0161306 A1 | 5/2020 | Seo |
| 2020/0185507 A1 | 6/2020 | Huang et al. |
| 2020/0295008 A1 | 9/2020 | Tang et al. |
| 2020/0395455 A1 | 12/2020 | Kim |
| 2020/0395461 A1 | 12/2020 | Kim |
| 2020/0402846 A1 | 12/2020 | Collins et al. |
| 2020/0411528 A1 | 12/2020 | Sung et al. |
| 2021/0013213 A1 | 1/2021 | Kim et al. |
| 2021/0013214 A1 | 1/2021 | Terada |
| 2021/0013318 A1 | 1/2021 | Cheng et al. |
| 2021/0035979 A1 | 2/2021 | Simsek-Ege et al. |
| 2021/0066460 A1 | 3/2021 | Haller |
| 2021/0066466 A1 | 3/2021 | Kwon et al. |
| 2021/0082767 A1 | 3/2021 | Kim et al. |
| 2021/0098376 A1 | 4/2021 | Lin et al. |
| 2021/0118676 A1 | 4/2021 | Kusumoto et al. |
| 2021/0125939 A1 | 4/2021 | Kothari et al. |
| 2021/0125996 A1 | 4/2021 | An et al. |
| 2021/0126103 A1 | 4/2021 | Nobuto |
| 2021/0151574 A1 | 5/2021 | Haller |
| 2021/0242320 A1 | 8/2021 | Huh et al. |
| 2021/0265475 A1 | 8/2021 | Yang |
| 2021/0320008 A1 | 10/2021 | Kim |
| 2022/0051937 A1 | 2/2022 | Huang |
| 2022/0059561 A1 | 2/2022 | Noh |
| 2022/0098731 A1 | 3/2022 | Wu et al. |
| 2022/0130677 A1 | 4/2022 | Savant et al. |

FOREIGN PATENT DOCUMENTS

| | | |
|---|---|---|
| IN | 201911013223 | 5/2019 |
| WO | 2011074987 | 6/2011 |
| WO | 2018191183 | 10/2018 |
| WO | 2019099997 | 5/2019 |

OTHER PUBLICATIONS

Wang, et al., "A New Two-Dimensional Analytical Threshold Voltage Model for Short-Channel Triple-Material 2 Surrounding-Gate Metal-Oxide-Semiconductor Filed-Effect Transistors", Japan Society of Applied Physics, vol. 51, (2012), pp. 054301-1-054301-5.

Wang, et al., "Ultra-Low Specific On-Resistance Lateral Double-Diffused Metal-Oxide-Semiconductor Transistor with Enhanced Dual-Gate and Partial P-Buried Layer", Nanoscale Research Letters, vol. 14, No. 38, (2019), 7 pages.

Wei, et al., "Accumulation Mode Triple Gate SOI LDMOS With Ultralow On-Resistance and Enhanced 4 Transconductance,", Proceedings of the 2016 28th International Symposium on Power Semiconductor Devices and ICs, (Jun. 12-16, 2016), pp. 171-174.

* cited by examiner

| 2 | 2 | 2 |
| 2 | 2 | 2 |
| 2 | 2 | 2 |
| 2 | 2 | 2 |

APPARATUS COMPRISING A METAL PORTION IN THE TOP PORTION OF CAPACITOR STRUCTURE, AND RELATED METHODS

RELATED APPLICATIONS

The entire contents of U.S. patent application Ser. No. 16/667,654, titled "APPARATUS COMPRISING WORD-LINES COMPRISING MULTIPLE METAL MATERIALS, AND RELATED METHODS AND ELECTRONIC SYSTEMS" and filed Oct. 29, 2019 are incorporated herein by reference.

BACKGROUND

Recently, in semiconductor devices such as dynamic random access memory, roughness may occur in the shape of the sidewalls at the memory mat ends, particularly in the end sidewalls of the upper electrodes of capacitors in some cases. If roughness exists in the sidewalls of the memory mat ends, it is necessary to increase the distance to peripheral circuits disposed between the memory mat ends and the adjacent memory mat to avoid being influenced by the roughness.

BRIEF DESCRIPTION OF THE DRAWINGS

FIG. 4 is a longitudinal section illustrating the schematic configuration of a portion along the line A-A in FIG. 2.

FIG. 5 is a longitudinal section illustrating the schematic configuration of a portion along the line A-A in FIG. 2.

FIG. 6 is a diagram illustrating one example of a schematic configuration in an exemplary process stage following FIG. 5. FIG. 6 is a longitudinal section illustrating the schematic configuration of a portion along the line A-A in FIG. 2.

FIG. 7 is a diagram illustrating one example of a schematic configuration in an exemplary process stage following FIG. 6. FIG. 7 is a longitudinal section illustrating the schematic configuration of a portion along the line A-A in FIG. 2.

FIG. 8 is a longitudinal section illustrating the schematic configuration of a portion along the line A-A in FIG. 2.

FIG. 9 is a longitudinal section illustrating a detailed view of the region G in FIG. 8.

DETAILED DESCRIPTION

Figure 1:
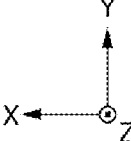
FIG. 1 is a plan view illustrating a schematic configuration of a portion of a semiconductor device according to an embodiment.

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Hereinafter, a semiconductor device according to the embodiment will be described with reference to the drawings. In the following description, dynamic random access memory (DRAM) is given as an example of the semiconductor device. In the description of the embodiment, common or related elements and elements that are substantially the same are denoted with the same signs, and the description thereof will be reduced or omitted. In the drawings referenced hereinafter, the dimensions and dimensional ratios of each unit in each of the drawings do not necessarily match the actual dimensions and dimensional rations in the embodiment. Furthermore, in the following description, the Y direction is perpendicular to the X direction. The X direction and the Y direction may also be referred to as the horizontal direction. The Z direction is the direction perpendicular to the X-Y plane defined as the plane of a semiconductor substrate, and may also be referred to as the vertical direction.

Figure 2:
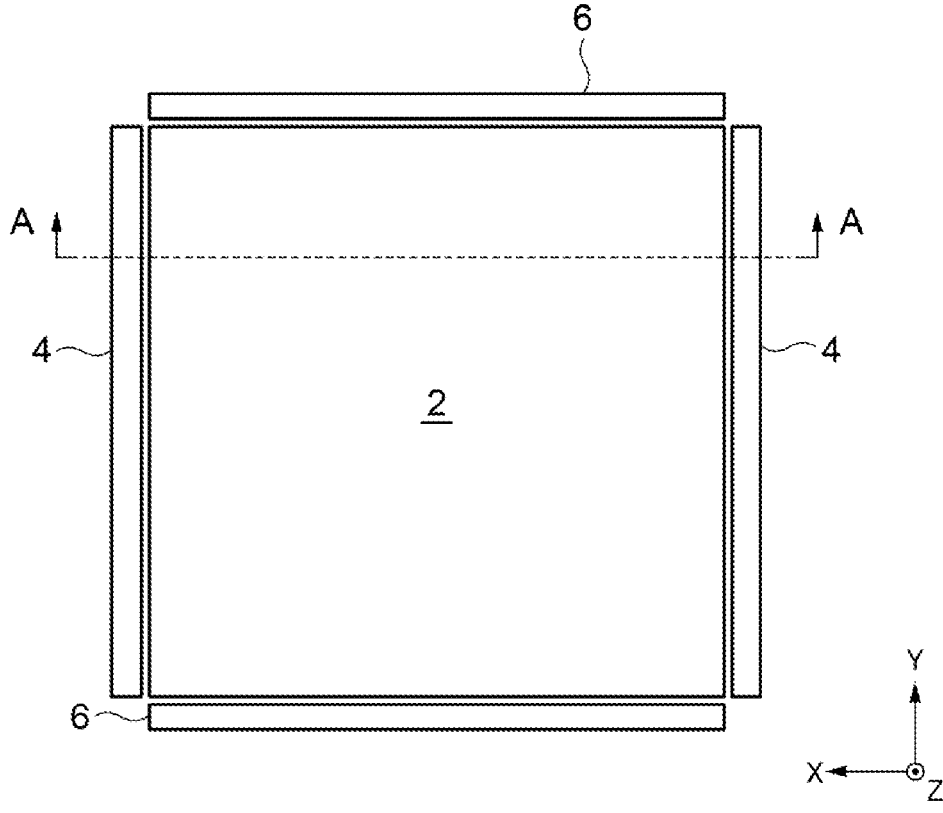
FIG. 2 is a plan view illustrating a schematic configuration of a memory mat and peripheral circuits according to the embodiment.

FIGS. 1 and 2 are diagrams illustrating plan-view layouts of the semiconductor device according to the embodiment. As illustrated in FIG. 1, the semiconductor device is provided with a plurality of memory mats 2 disposed in a matrix on the surface of a semiconductor substrate. Each memory mat 2 has a substantially square shape. As illustrated in FIG. 2, a first peripheral circuit region 4 is disposed along the edges of the memory mat 2 in the X direction. The first peripheral circuit region 4 is provided with a sub-word driver, for example. As described later, the sub-word driver is connected to the word-lines of a plurality of memory cells arranged in the memory mat 2. The first peripheral circuit region 4 is disposed between adjacent memory mats 2. A second peripheral circuit region 6 is disposed along the edges of the memory mat in the Y direction. The second peripheral circuit region 6 is provided with a sense amplifier, for example.

Figure 3:
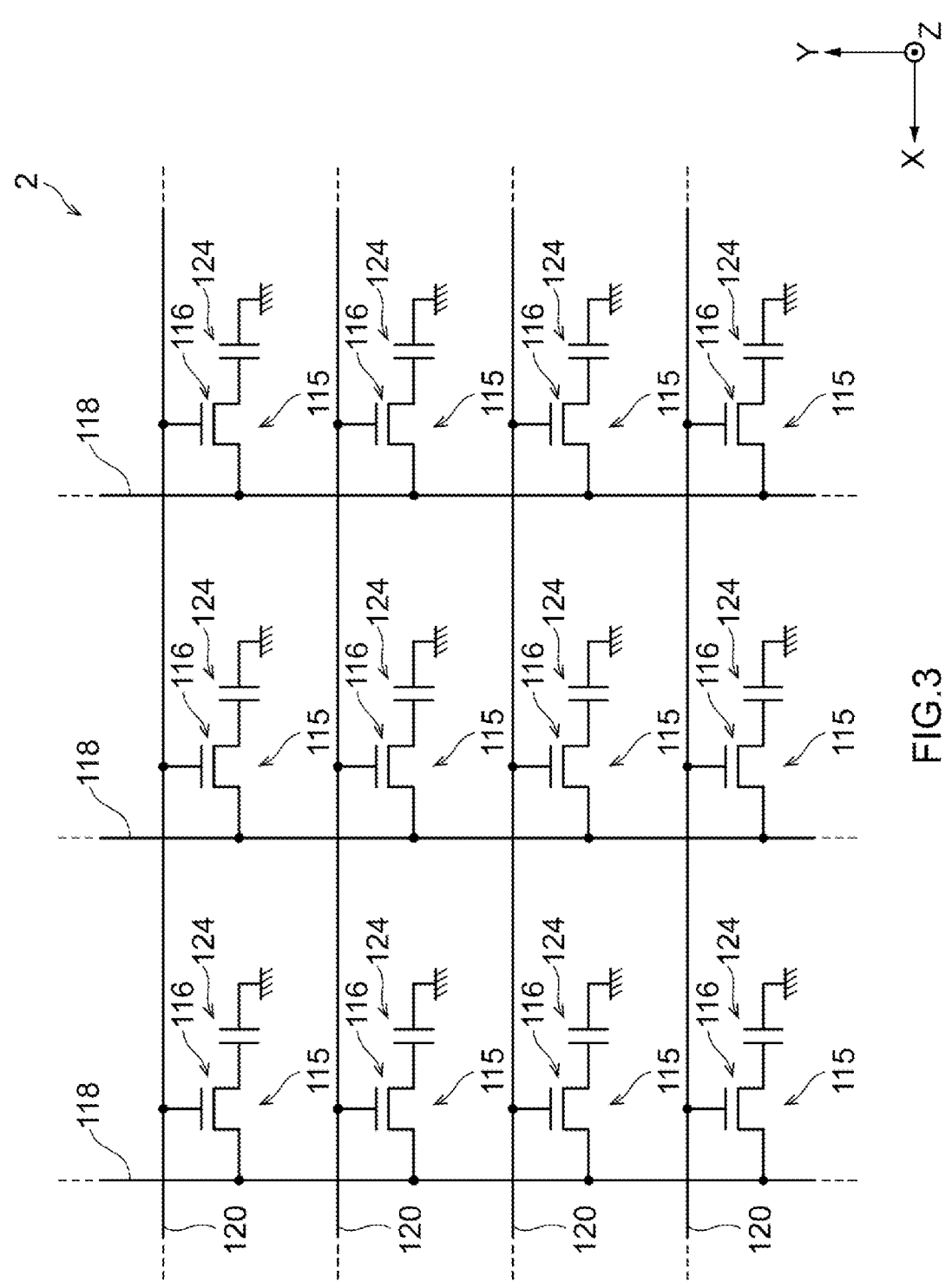
FIG. 3 is a diagram illustrating an equivalent circuit of memory cells in a semiconductor device according to the embodiment.

FIG. 3 illustrates an equivalent circuit of a memory cell array of the semiconductor device according to the embodiments. A plurality of memory cells 115 are arranged in a matrix, with each memory cell 115 being connected to an intersection point between a plurality of word-lines 120 and a plurality of bit-lines 118 disposed orthogonally. A single memory cell 115 includes a pair of an access transistor 116 and a storage capacitor 124. Note that the storage capacitor 124 corresponds to a capacitor 34 described later.

The access transistor 116 is provided with a metal-oxide-semiconductor field-effect transistor (MOSFET), for example. In each of the memory mats 2, a plurality of word-lines 120 are disposed in parallel, extending in the X direction of the diagram. In the memory mats 2, a plurality of bit-lines 118 are disposed in parallel, extending in the Y direction of the diagram. The gate electrode of the access transistor 116 functions as a DRAM word-line 120. The word-line 120 functions as a control line that controls the selection of the corresponding memory cell.

One of the source or the drain of the access transistor 116 is connected to a corresponding bit-line 118, while the other is connected to the storage capacitor 124. The storage capacitor 124 includes a capacitor and stores data by holding accumulated charge in the capacitor.

Each of the word-lines 120 is connected to the first peripheral circuit region 4 at the periphery of the memory mat 2. The bit-lines 118 are connected to the second peripheral circuit region 6 at the periphery of the memory mat 2.

When writing data to one of the memory cells 115, a potential that turns on the access transistor 116 is applied to the word-line 120, while a low potential or a high potential corresponding to "0" or "1" of the data to be written is applied to the bit-line 118. When reading out data from one of the memory cells 115, a potential that turns on the access transistor 116 is applied to the word-line 120. With this arrangement, a data determination is made by having a sense amplifier in the second peripheral circuit region 6 connected to the bit-line 118 sense the potential drawn out from the storage capacitor 124 to the bit-line 118.

Figure 4:
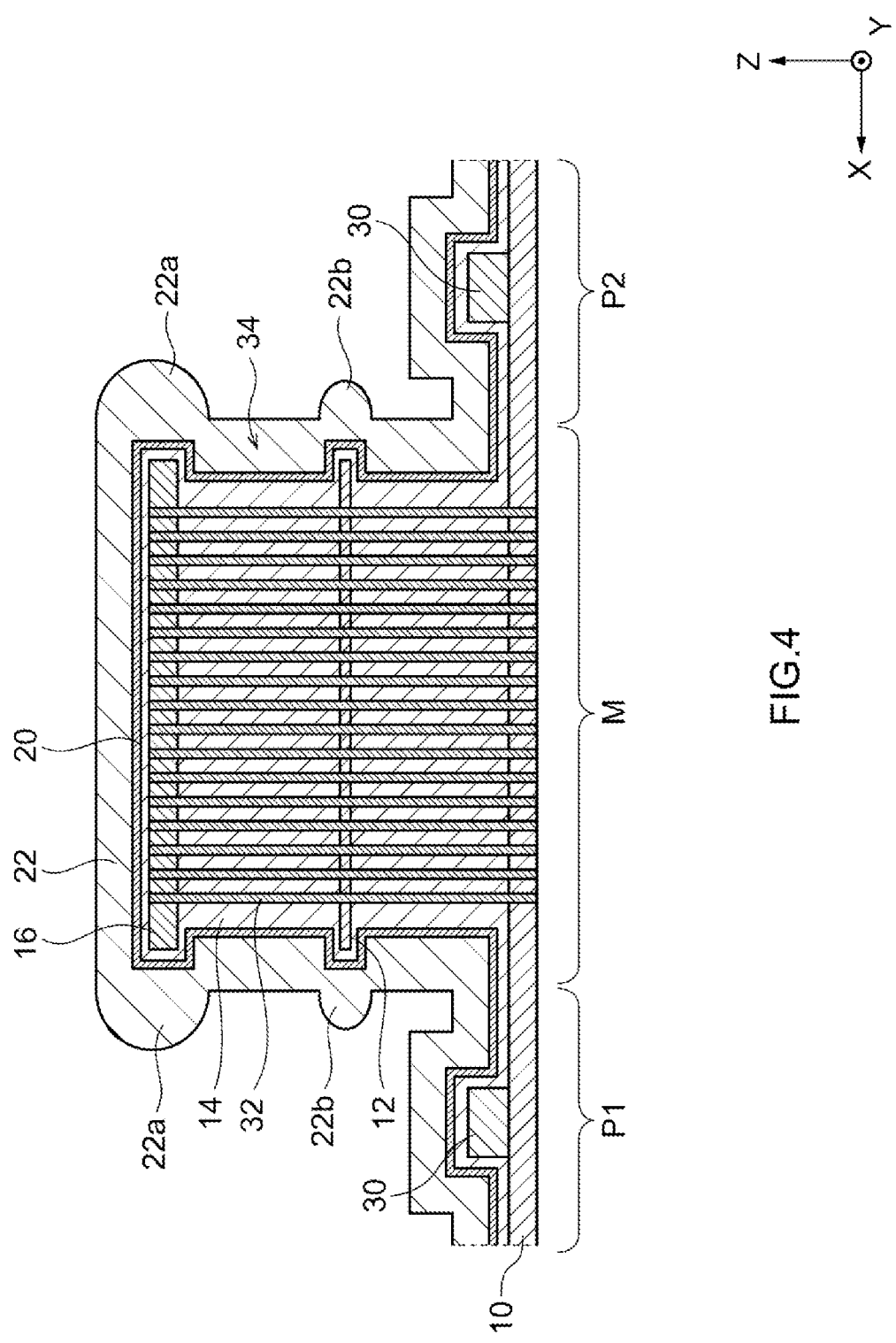
FIG. 4 is a diagram illustrating the semiconductor device and the method of manufacturing the same according to the embodiment, and is a diagram illustrating one example of the schematic configuration in an exemplary process stage.
Figure 9:
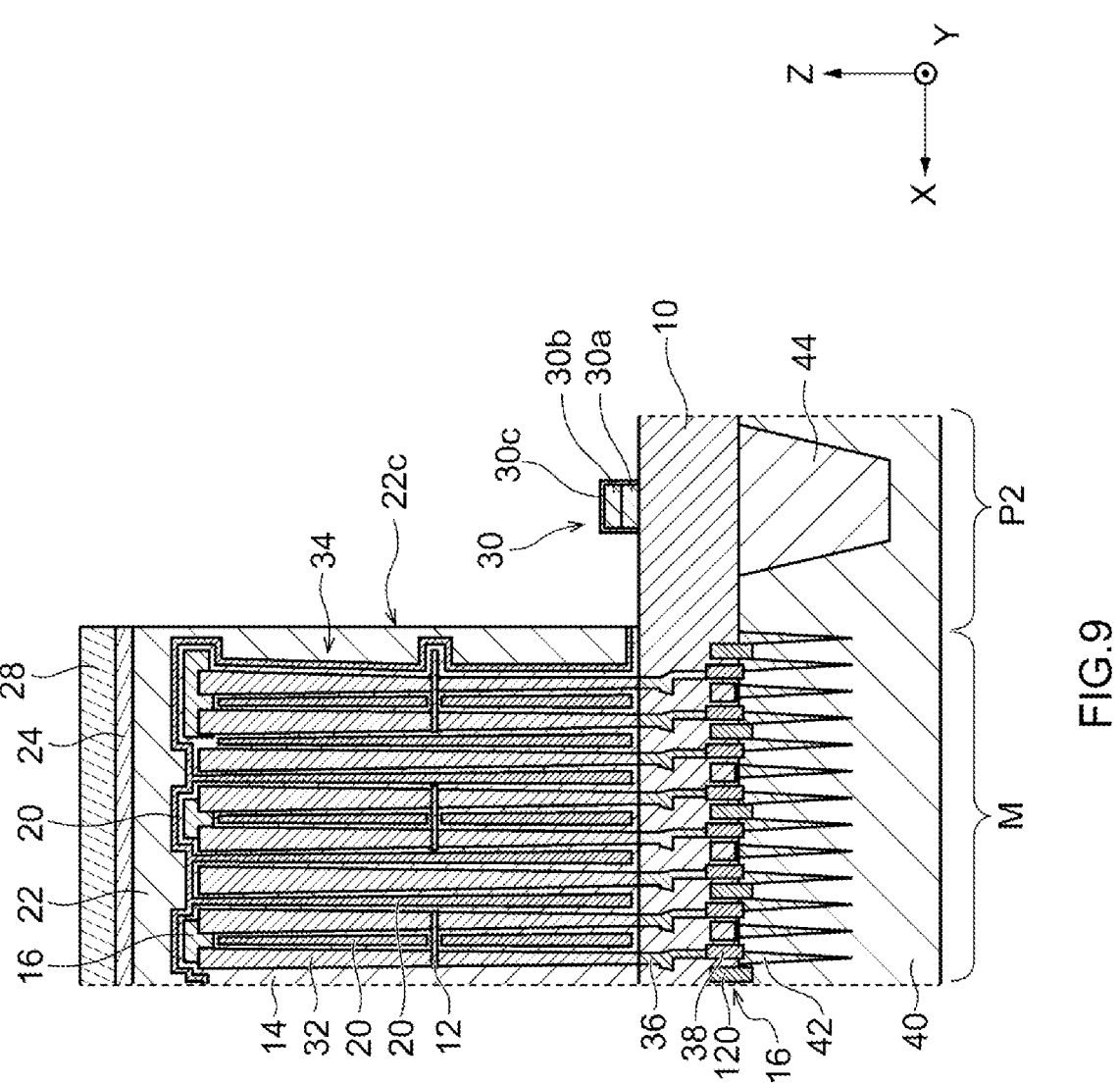
FIG. 9 is a diagram illustrating a schematic configuration of the semiconductor device according to the embodiment.

FIG. 4 is a diagram illustrating a method of forming the semiconductor device according to the embodiment. In the step illustrated in FIG. 4, the capacitor 34 is formed. The capacitor 34 is provided with lower electrodes 32, a capacitor dielectric film 14, and a first upper electrode 20. FIG. 4 illustrates a schematic configuration of a longitudinal section on the line A-A in FIG. 2. As illustrated in FIG. 4, the memory mat 2 is disposed in a memory cell region M. As illustrated in FIG. 3, a plurality of memory cells, each of which is provided with the capacitor 34, are arranged in the memory mat 2. Peripheral circuits P1 and P2 are disposed in the regions adjacent to the memory mat 2 in the X direction. A plurality of peripheral circuit wirings 30 are disposed in the peripheral circuits P1 and P2. In FIG. 4, two of the plurality of peripheral circuit wirings 30 on either side of a second upper electrode 22 covering the capacitor 34 are illustrated. Although FIG. 4 illustrates an example in which the first peripheral circuit region 4 is disposed in the peripheral circuits P1 and P2, there may also be a second peripheral circuit region 6. The peripheral circuit wirings 30 illustrated in FIG. 4 are one of the wirings disposed closest to the memory mat 2. The capacitor 34 and the peripheral circuit wirings 30 are disposed on a first dielectric film 10. Below the first dielectric film 10, as illustrated in FIG. 9, a silicon substrate, the access transistor 116, and first capacitor contacts 38 and second capacitor contacts 36 that connect the source/drain of the access transistor 116 with the capacitor 34 are provided. FIG. 9 will be described later.

The capacitor 34 is provided in the memory cell region M on top of the first dielectric film 10. The first dielectric film 10 contains an insulating material such as silicon nitride (SiN), for example. The capacitor 34 is provided with a plurality of lower electrodes 32 and a capacitor dielectric film 14 that covers the lower electrodes 32. The lower electrodes 32 contain a conductive metal material such as titanium nitride (TiN), for example. The capacitor dielectric film 14 contains a high-dielectric insulating material such as zirconium oxide (ZrO), for example. Each of the lower electrodes 32 is pillar-shaped extending in the Z direction of the diagram. The lower electrodes 32 penetrate through the first dielectric film 10, and as illustrated in FIG. 9, are connected to the first capacitor contacts 38 and the second capacitor contacts 36 that connect the source/drain of the access transistor 116 with the capacitor 34.

A first beam dielectric film 12 and a second beam dielectric film 16 are in contact with the lower electrodes 32 and function as beams that support the lower electrodes 32 to keep the lower electrodes 32 from collapsing during the process. The first beam dielectric film 12 and the second beam dielectric film 16 contain an insulating material such as silicon nitride (SiN), for example. The first beam dielectric film 12 and the second beam dielectric film 16 project out farther in the horizontal direction than the lower electrodes 32.

The capacitor dielectric film 14 covers the top and side surfaces of each of the plurality of lower electrodes 32 and the top, bottom, and side surfaces of the first beam dielectric film 12 and the second beam dielectric film 16. A multilayer film of the first upper electrode 20 and the second upper electrode 22 covers the top and side surfaces of the capacitor dielectric film 14. The first upper electrode 20 contains a conductive metal material such as titanium nitride (TiN), for example. The second upper electrode 22 contains conductive material such as polysilicon doped with an impurity such as phosphorus or arsenic, for example. The second upper electrode 22 is 100 nm thick, for example. The second upper electrode 22 projects out in the X direction to form projections 22a and 22b in the X direction of the first beam dielectric film 12 and the second beam dielectric film 16.

Figure 5:
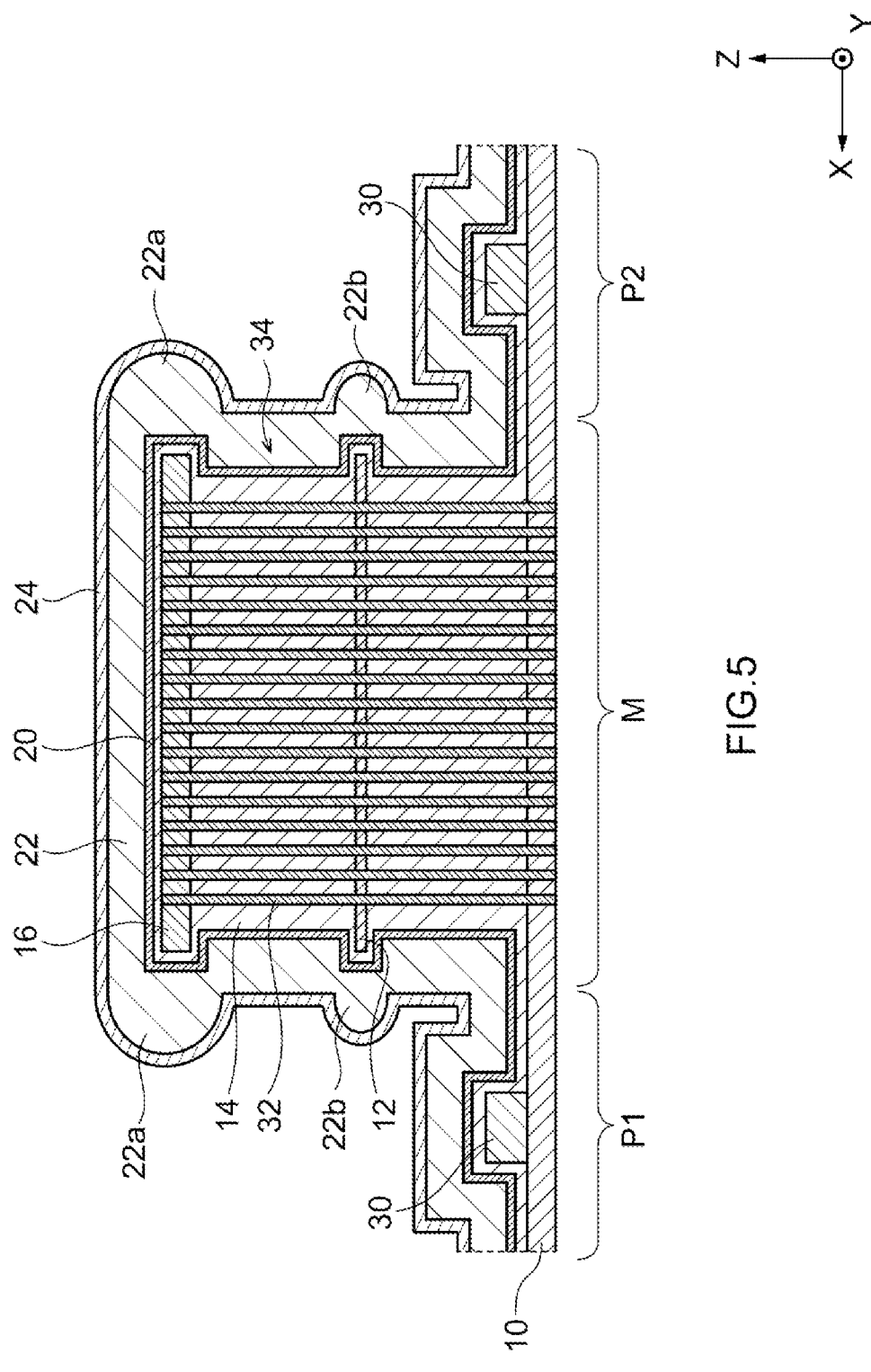
FIG. 5 is a diagram illustrating the semiconductor device and the method of manufacturing the same according to the embodiment, and is a diagram illustrating one example of the schematic configuration in an exemplary process stage following FIG. 4.

Next, as illustrated in FIG. 5, a third upper electrode 24 is formed to cover the second upper electrode 22. The third upper electrode 24 contains a conductive metal material such as tungsten nitride (WN), for example. The third upper electrode 24 is formed by sputtering, for example. The third upper electrode 24 is formed to be substantially thin so that etching is performed easily in a later step. The third upper electrode 24 is, for example, 10 nm thick in the thinnest portions. With this arrangement, the capacitor 34 and the second upper electrode 22 and third upper electrode 24 covering the capacitor 34 are formed, as illustrated in FIG. 5.

Figure 6:
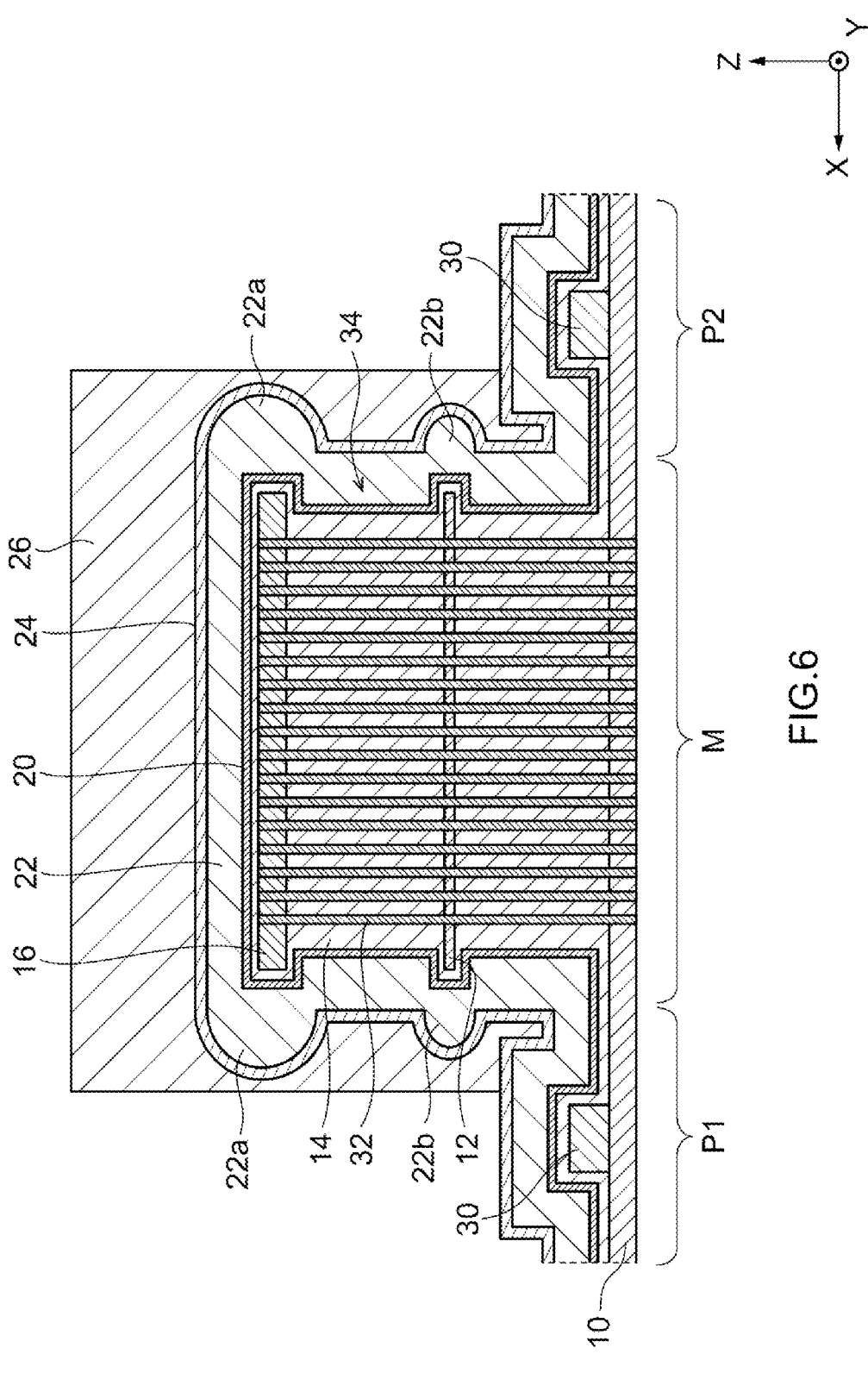
FIG. 6 is a diagram illustrating a method of forming a semiconductor device according to the embodiment.

Next, as illustrated in FIG. 6, a resist 26 is formed to cover the area around the lower electrodes 32, the capacitor dielectric film 14, the first upper electrode 20, the second upper electrode 22, and the third upper electrode 24 in the memory cell region M. The resist 26 is formed by applying, exposing, and developing resist using known lithography technology. The peripheral circuits P1 and P2 are substantially not covered by the resist 26. Through the above steps, the area around the capacitor 34, the second upper electrode 22, and the third upper electrode 24 is covered by the resist 26, as illustrated in FIG. 6.

Figure 7:
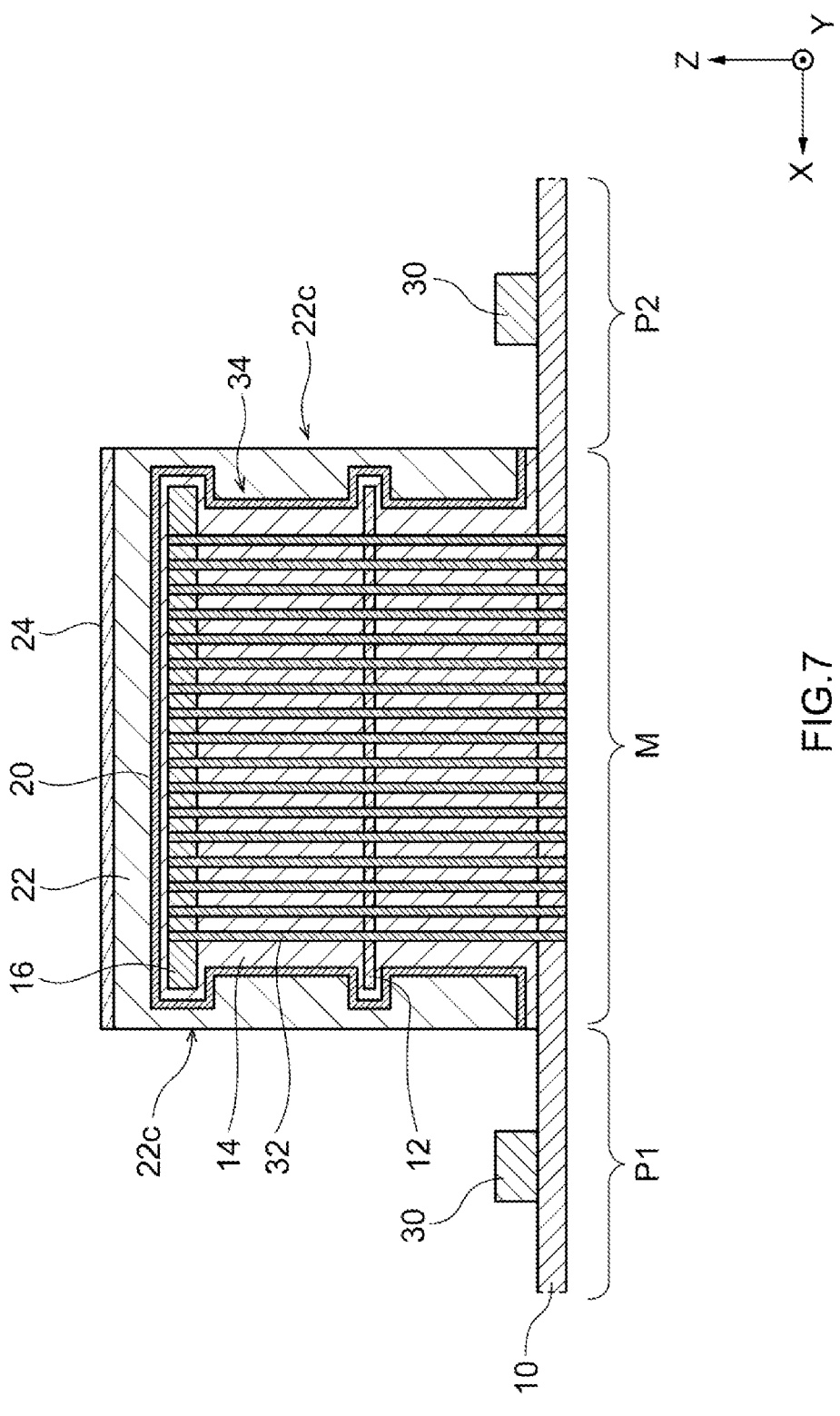
FIG. 7 is a diagram illustrating a method of forming a semiconductor device according to the embodiment.

Next, as illustrated in FIG. 7, dry etching using the resist 26 as a mask is performed to remove the capacitor dielectric film 14, the first upper electrode 20, the second upper electrode 22, and the third upper electrode 24 in the area outside the memory cell region M. The dry etching includes etching under first conditions followed by etching under second conditions described below.

In the etching under the first conditions, anisotropic dry etching is performed. In the etching under the first conditions, etching proceeds in the Z direction, or in other words the vertical direction, such that the third upper electrode 24, the second upper electrode 22, and the capacitor dielectric film 14 in the peripheral circuits P1 and P2 not covered by the resist 26 are etched.

In the etching under the second conditions that follows the etching under the first conditions, isotropic dry etching is performed in order on the resist 26, the third upper electrode 24, and the second upper electrode 22. In the etching under the second conditions, etching proceeds not only in the vertical direction but also the horizontal direction. In the etching under the second conditions, first, the resist 26 is etched until the side surfaces of the third upper electrode 24 in the memory cell region M are exposed. Next, the third upper electrode 24 and the second upper electrode 22 are etched in order. As illustrated in FIG. 7, the etching of the third upper electrode 24 is performed while leaving some horizontal thickness of the third upper electrode 24 to keep the first upper electrode 20 from being exposed. Also, due to the etching under the second conditions, the projections 22a and 22b disappear, and side surfaces 22c which are vertically straight planes in a cross section are formed.

The resist 26 is thick enough in the vertical direction so that the resist 26 covering the top surface of the third upper electrode 24 remains after the etching under the first and second conditions. Consequently, the third upper electrode 24 and the second upper electrode 22 on top of the memory cell region M remain without being etched. Through the above steps, as illustrated in FIG. 7, a structure is formed in the memory cell region M in which the capacitor 34 provided with the lower electrodes 32, the capacitor dielectric film 14, and the first upper electrode 20 is covered by the second upper electrode 22, and the third upper electrode 24 is provided only on the top surface of the second upper electrode 22. In the peripheral circuits P1 and P2, the capacitor dielectric film 14, the first upper electrode 20, the second upper electrode 22, and the third upper electrode 24 are removed, leaving the first dielectric film 10 and the peripheral circuit wirings 30 exposed. As illustrated in FIG. 9, the top and side surfaces of the peripheral circuit wiring 30 are covered by surrounding insulation 30c.

Figure 8:
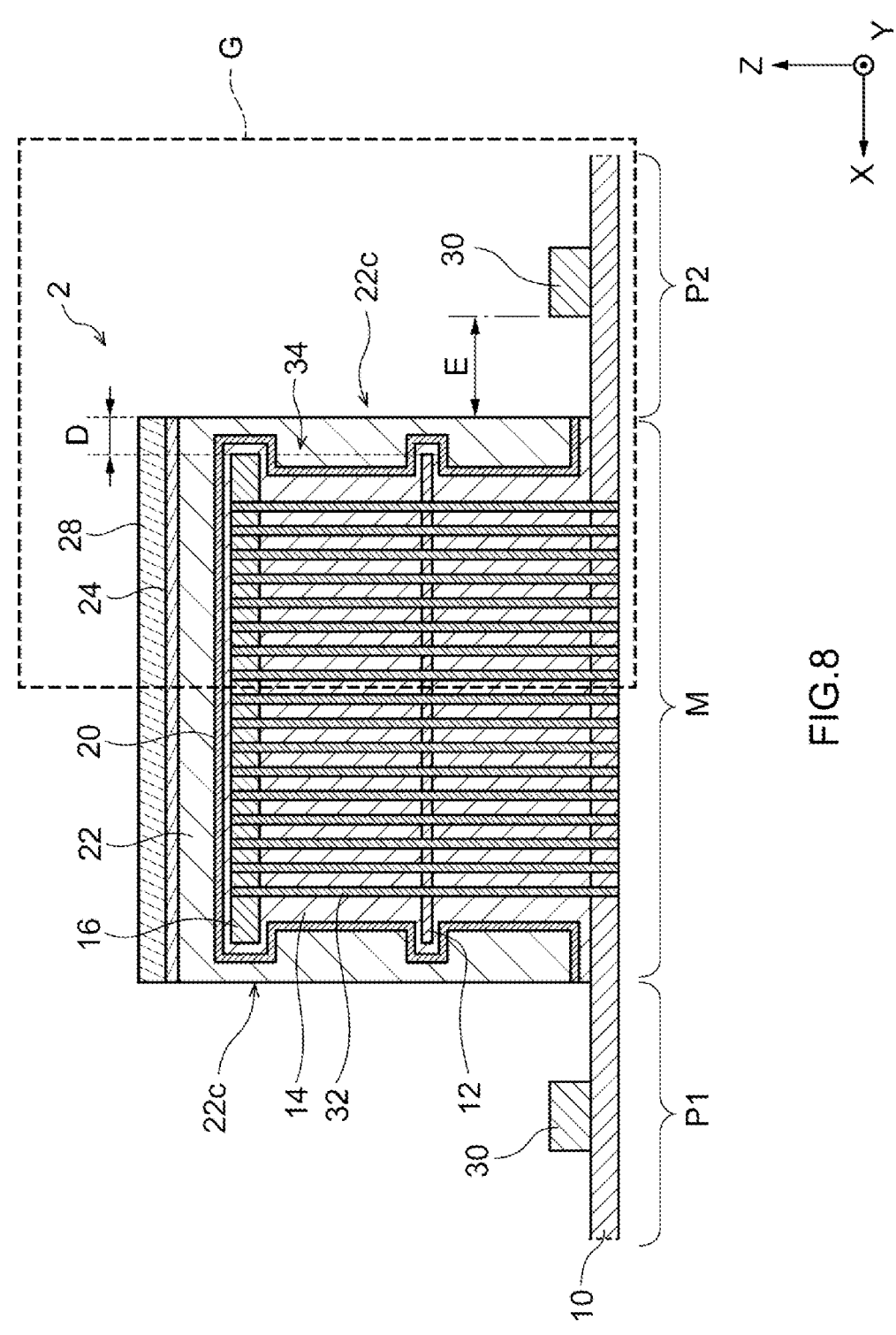
FIG. 8 is a diagram illustrating the schematic configuration and the method of manufacturing the semiconductor device according to the embodiment, and is a diagram illustrating one example of the schematic configuration in an exemplary process stage following FIG. 7.

Next, as illustrated in FIG. 8, a 4th upper electrode 28 is formed only on the top surface of the third upper electrode 24. The 4th upper electrode 28 is not formed on the first dielectric film 10 and the peripheral circuit wirings 30. The 4th upper electrode 28 is formed as follows.

The metal material of the 4th upper electrode 28 may be formed by a CVD process or by an ALD process that uses a metal precursor (e.g., a tungsten precursor) and a reducing agent. The metal precursor may be substantially free of fluorine atoms. Throughout the formation of the metal material of the 4th upper electrode 28, relative amounts of the metal precursor and the reducing agent may be adjusted to form the metal material of the 4th upper electrode 28 by the bottom up process. For instance, an initial portion of the metal material of the 4th upper electrode 28 may be formed on the upper surface of the third upper electrode 24 by subjecting the 4th upper electrode 28 to gases that include a relatively low amount of the metal precursor and a relatively high amount of the reducing agent. By way of example only, the metal precursor may initially account for from about 5% to about 20% of a volume of the gases introduced to a chamber (e.g., a CVD chamber, an ALD chamber) in which the capacitor 34, the second upper electrode 22 covering the capacitor 34 and the third upper electrode 24 vertically stacked on the second upper electrode 22 is placed and the reducing agent may initially account for from about 80% to about 95% of the volume of the gases introduced to the chamber. After forming the initial portion, the metal material of the 4th upper electrode 28 may be formed to the desired thickness by increasing the amount of the metal precursor relative to the amount of the reducing agent. By way of example only, the metal precursor may account for from about 40% to about 80% of the volume of the gases and the reducing agent may initially account for from about 20% to about 60% of the volume of the gases to form the metal material of the 4th upper electrode 28 to the desired thickness.

If the metal material of the 4th upper electrode 28 is, for example, tungsten, a tungsten precursor may be a chlorine-based tungsten precursor, such as a $WCl_x$ gas where x is an integer between 2 and 6. The reducing agent may be hydrogen, such as $H_2$ gas. The $WCl_x$ and $H_2$ gases may be sequentially introduced into the chamber in which the capacitor 34, the second upper electrode 22 and the third upper electrode 24 placed at the stage illustrated in FIG. 7. CVD process and ALD process, as well as CVD chambers and ALD chambers, are known in the art and are not described in detail herein. The $WCl_x$ gas may be used as the tungsten precursor to prevent or substantially reduce damage to the tungsten nitride (WN) material of the third upper electrode 24, which damage is observed when conventional fluorine-based tungsten precursors are used. The $WCl_x$ gas may include, but is not limited to, $WCl_2$, $WCl_4$, $WCl_5$, $WCl_6$, or a combination thereof. Throughout the formation of the tungsten material of the 4th upper electrode 28, relative amounts of the $WCl_x$ gas and the $H_2$ gas may be adjusted. An initial portion of the tungsten material of the 4th upper electrode 28 may be formed on the upper surface of the tungsten nitride material of the third upper electrode 24 exposing to the $WCl_x$ gas and the $H_2$ gas, with a greater amount of $H_2$ gas present relative to the amount of $WCl_x$ gas. To achieve the desired relative amount of the $WCl_x$ and $H_2$ gases, the flow rate of the $H_2$ gas into the chamber may be greater than the flow rate of the $WCl_x$ gas. By introducing the $WCl_x$ gas into the chamber at a lower flow rate than the $H_2$ gas, the initial portion of the tungsten material of the 4th upper electrode 28 is formed on the upper surface of the tungsten nitride material of the third upper electrode 24 without damaging (e.g., etching) the tungsten nitride material of the third upper electrode 24 and without substantially incorporating tungsten into the tungsten nitride material of the third upper electrode 24. By way of example only, the flow rate of the $H_2$ gas may initially be from about 100 sccm to about 3000 sccm, and the flow rate of the $WCl_x$ gas may initially be from about 10 mg/m to about 300 mg/m. The $WCl_x$ gas may react with the hydrogen gas to form the tungsten material of the 4th upper electrode 28 on the tungsten nitride material of the third upper electrode 24. Without being bound by any theory, it is believed that the tungsten material of the 4th upper electrode 28 selectively forms on the tungsten nitride material of the third upper electrode 24 due to a difference in reactivity between the tungsten precursor and the tungsten nitride material of the third upper electrode 24 compared to the tungsten precursor and the first dielectric film 10. Forming the tungsten material of the 4th upper electrode 28 using the $WCl_x$ gas eliminates the necessity for forming a tungsten nucleation layer on the first dielectric film 10 or a dielectric material covering the peripheral circuit wiring 30.

After forming the initial portion, the tungsten material of the 4th upper electrode 28 may be formed to the desired thickness by increasing the amount of the tungsten precursor relative to the amount of the $H_2$ gas. By way of example only, the tungsten precursor may account for from about 40% to about 80% of the volume of the gases and the $H_2$ gas may initially account for from about 20% to about 60% of the volume of the gases to form the tungsten material of the 4th upper electrode 28 to the desired thickness.

Through the above steps, as illustrated in FIG. 8, the 4th upper electrode 28 is selectively formed on the third upper electrode 24. As illustrated in FIG. 8, the semiconductor device according to the embodiment is provided with the storage capacitor 34. The capacitor 34 is provided with the lower electrodes 32, the capacitor dielectric film 14 that covers the lower electrodes 32, and the first upper electrode 20 that covers the capacitor dielectric film 14. On top of the first upper electrode 20, the second upper electrode 22 that covers the first upper electrode 20, the third upper electrode 24 that covers the top surface of the second upper electrode 22, and the 4th upper electrode 28 which is vertically adjacent to the third upper electrode 24 and which covers the top surface of the third upper electrode 24 are provided. The lower electrodes 32 are supported by the first beam dielectric film 12 and the second beam dielectric film 16 that extend horizontally. The ends of the first beam dielectric film 12 and the second beam dielectric film 16 project out farther in the horizontal direction than the lower electrodes 32. The 4th upper electrode 28 is formed only on the top surface of the third upper electrode 24, or in other words, the top portion of the capacitor 34. The 4th upper electrode 28 is not formed on the side surfaces 22c of the second upper electrode 22 that covers the capacitor 34, and is not formed in the peripheral circuits P1 and P2. The capacitor 34 is provided with the side surfaces 22c which are straight planes in a cross section.

FIG. 9 is a longitudinal section illustrating a detailed view of the region G in FIG. 8. As illustrated in FIG. 9, the semiconductor device according to the embodiment is provided with, in the memory cell region M, a semiconductor substrate 40, an isolation 42, the access transistor 116, the first capacitor contacts 38, the second capacitor contacts 36, the first dielectric film 10, and the capacitor 34, the second upper electrode 22 that covers the capacitor 34, and the third upper electrode 24 and the 4th upper electrode 28 disposed on top of the second upper electrode 22. The capacitor 34 is formed on the first dielectric film 10. In the peripheral circuit P1, a peripheral isolation 44 and the peripheral circuit wiring 30 are provided. The isolation 42 and the peripheral isolation 44 are provided in the semiconductor substrate 40. The access transistor 116 also functions as the word-line 120.

In the capacitor 34, the multilayer film of the capacitor dielectric film 14 and the first upper electrode 20 is disposed near the lower electrodes 32. The second upper electrode 22 is disposed surrounding the capacitor 34. On the top surface of the second upper electrode 22, the multilayer film of the third upper electrode 24 and the 4th upper electrode 28 is disposed. The peripheral circuit wiring 30 is provided with a conductive part 30a, an upper insulating part 30b disposed on the conductive part 30a, and a surrounding insulating part 30c that covers the side and top surfaces of the layered structure of the conductive part 30a and the upper insulating part 30b. The conductive part 30a contains a conductive material such as polysilicon, tungsten, or tungsten nitride, for example. The upper insulating part 30b and the surrounding insulating part 30c contain an insulating material such as silicon nitride, for example. In the peripheral circuit wiring 30, since the area around the conductive part is covered by insulating materials, the 4th upper electrode 28 is not formed on top of the peripheral circuit wiring 30. The rest of the configuration in FIG. 9 is the same as FIG. 8.

As illustrated in FIGS. 8 and 9, in the semiconductor device according to the embodiment, the planar side surfaces 22c are formed and the 4th upper electrode 28 is formed only above the third upper electrode 24 without being formed on the side surfaces 22c of the second upper electrode 22 that covers the capacitor 34. Therefore, the distance D from the ends of the first beam dielectric film 12 and the second beam dielectric film 16 to the side surfaces 22c can be decreased. By decreasing the distance D, the distance E from the side surface 22c to the peripheral circuit wiring 30 can be increased. This arrangement makes it possible to bring the peripheral circuit wiring 30 even closer to the capacitor 34 and the second upper electrode 22 that covers the capacitor 34, thereby making it possible to shrink the size of the semiconductor device.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
   a plurality of capacitors, each capacitor including first and second conductive portions and a dielectric portion therebetween;
   a first conductive structure containing the plurality of capacitors therein, and electrically coupled to the second conductive portions of the plurality of capacitors;
   a second conductive structure on a top surface of the first conductive structure, wherein the second conductive structure covers the top surface of the first conductive structure; and
   a third conductive structure on a top surface of the second conductive structure.

2. The apparatus of claim 1, wherein the second conductive structure and the third conductive structure do not cover a side wall of the capacitors.

3. The apparatus of claim 1, wherein the first conductive structure, the second conductive structure and the third conductive structure comprise different materials, respectively.

4. The apparatus of claim 1, wherein the first conductive structure comprises impurity-doped polysilicon.

5. The apparatus of claim 1, wherein the second conductive structure comprises tungsten nitride.

6. The apparatus of claim 1, wherein the third conductive structure comprises tungsten.

7. The apparatus of claim 1, wherein the first conductive portion has a pillar shape.

8. The apparatus of claim 1, wherein the third conductive structure is formed from an initial tungsten portion formed on the surface of the second conductive structure.

US 12,604,458 B2

9

9. An apparatus comprising:
a memory array including a plurality of memory cells;
a first conductive structure covering the memory array to contain the plurality of memory cells therein, the first conductive structure having a top surface and side surfaces;
a second conductive structure on the top surface of the first conductive structure without covering the side surfaces of the first conductive structure; and
a third conductive structure on a top surface of the second conductive structure without covering the side surfaces of the first conductive structure, wherein the second conductive structure and the third conductive structure comprise different materials.

10. The apparatus of claim 9, wherein the first conductive structure, the second conductive structure and the third conductive structure are composed of different materials, respectively.

11. The apparatus of claim 9, wherein the first conductive structure comprises impurity-doped polysilicon.

12. The apparatus of claim 9, wherein the second conductive structure comprises tungsten nitride and the third conductive structure comprises tungsten.

13. The apparatus of claim 9, wherein the plurality of memory cells comprise DRAM memory cells.

14. The apparatus of claim 13, wherein the DRAM memory cells comprise capacitors each having first and second conductive portions and the second conductive portion of each capacitor is electrically coupled to the first conductive structure.

15. The apparatus of claim 14, wherein the first conductive portion has a pillar shape.

16. The apparatus of claim 1, wherein the second conductive structure and the third conductive structure do not cover a sidewall of the first conductive structure.

17. The apparatus of claim 9, wherein the third conductive structure is on the top surface of the second conductive structure without covering side surfaces of the second conductive structure.

* * * * *